(12) United States Patent
Zhang et al.

(10) Patent No.: US 11,495,731 B2
(45) Date of Patent: Nov. 8, 2022

(54) MULTILAYER PZT ELECTRODE CONFIGURATION FOR SUSPENSION STROKE INCREASE

(71) Applicant: Magnecomp Corporation, Murrieta, CA (US)

(72) Inventors: Long Zhang, Murrieta, CA (US); Kuen Chee Ee, Chino, CA (US); David Glaess, Bangkok (TH); Peter Hahn, Bangkok (TH); Johnathan Phu, Wangnoi (TH)

(73) Assignee: Magnecomp Corporation, Murrieta, CA (US)

( * ) Notice: Subject to any disclaimer, the term of this patent is extended or adjusted under 35 U.S.C. 154(b) by 567 days.

(21) Appl. No.: 16/565,060

(22) Filed: Sep. 9, 2019

(65) Prior Publication Data

US 2020/0091404 A1 Mar. 19, 2020

Related U.S. Application Data

(60) Provisional application No. 62/730,979, filed on Sep. 13, 2018.

(51) Int. Cl.
*H01L 41/09* (2006.01)
*H01L 41/083* (2006.01)
(Continued)

(52) U.S. Cl.
CPC ........ *H01L 41/0926* (2013.01); *G11B 5/4806* (2013.01); *H01L 41/0471* (2013.01); *H01L 41/0472* (2013.01); *H01L 41/083* (2013.01)

(58) Field of Classification Search
CPC .............. H01L 41/083; H01L 41/0472; H01L 41/0471; H01L 41/0926; G11B 5/4806
See application file for complete search history.

(56) References Cited

U.S. PATENT DOCUMENTS 6,396,196 B1 5/2002 Takeuchi et al.
8,810,972 B1 8/2014 Dunn
(Continued)

FOREIGN PATENT DOCUMENTS

CN 1141474 A 1/1997
CN 1405905 A 3/2003
(Continued)

OTHER PUBLICATIONS

Office Action in Chinese Patent Application No. 201910869268.1, dated Mar. 18, 2022.

*Primary Examiner* — J. San Martin
(74) *Attorney, Agent, or Firm* — DLA Piper LLP (US)

(57) ABSTRACT

A piezoelectric actuator assembly is described. The assembly including a first layer including a top and a bottom surfaces. The assembly including a second layer having a top and a bottom surfaces, the bottom surface of the second layer is disposed over the top surface of the first layer. The assembly including a third layer having a top and a bottom surfaces, the bottom surface of the third layer is disposed over the top surface of the second layer. The assembly includes a first electrode, a second electrode, a third electrode, and a fourth electrode. The third electrode is configured to be shorter than the second electrode such that the active PZT length of the second layer and the third layer is shorter than the active PZT length of the first layer.

14 Claims, 8 Drawing Sheets

(51) Int. Cl.
*G11B 5/48* (2006.01)
*H01L 41/047* (2006.01)

(56) References Cited

U.S. PATENT DOCUMENTS

| | | | |
|---|---|---|---|
| 9,064,510 B1 | 6/2015 | Kikuchi et al. | |
| 9,070,394 B1 | 6/2015 | Hahn et al. | |
| 9,117,468 B1 | 8/2015 | Zhang et al. | |
| 9,318,136 B1 | 4/2016 | Bjorstrom et al. | |
| 9,330,694 B1 | 5/2016 | Hahn et al. | |
| 9,330,696 B1 | 5/2016 | Hahn et al. | |
| 9,330,698 B1 | 5/2016 | Hahn et al. | |
| 9,330,699 B1 | 5/2016 | Hahn et al. | |
| 9,390,739 B1 | 7/2016 | Zhang et al. | |
| 9,741,376 B1 | 8/2017 | Ee et al. | |
| 10,074,390 B1 | 9/2018 | Hahn et al. | |
| 10,128,431 B1 | 11/2018 | Dunn et al. | |
| 10,325,621 B1 | 6/2019 | Hahn et al. | |
| 2002/0105750 A1 | 8/2002 | Li et al. | |
| 2003/0020377 A1* | 1/2003 | Namerikawa | H01L 41/094 310/365 |
| 2003/0048041 A1 | 3/2003 | Kita et al. | |
| 2003/0137777 A1 | 7/2003 | Boutaghou et al. | |
| 2004/0207296 A1* | 10/2004 | Namerikawa | H01L 41/0831 310/367 |
| 2005/0105203 A1 | 5/2005 | Zhu et al. | |
| 2005/0179344 A1* | 8/2005 | Shibata | H01L 41/094 310/328 |
| 2005/0285480 A1 | 12/2005 | Hida et al. | |
| 2008/0226878 A1 | 9/2008 | Benslimane et al. | |
| 2009/0086379 A1 | 4/2009 | Hanya et al. | |
| 2009/0290263 A1 | 11/2009 | Yao et al. | |
| 2010/0038998 A1 | 2/2010 | Onishi et al. | |
| 2017/0155033 A1 | 6/2017 | Ikeda et al. | |
| 2017/0207383 A1 | 7/2017 | Xiong et al. | |
| 2017/0345450 A1 | 11/2017 | Ee et al. | |
| 2019/0237653 A1* | 8/2019 | Kishimoto | H01L 41/0471 |

FOREIGN PATENT DOCUMENTS

| | | |
|---|---|---|
| CN | 1455927 A | 11/2003 |
| CN | 101639560 A | 2/2010 |
| CN | 107424631 A | 12/2017 |
| CN | 107689231 A | 2/2018 |
| JP | 2000-308372 A | 11/2000 |
| JP | 2018-50033 A | 3/2018 |

* cited by examiner

MULTILAYER PZT ELECTRODE CONFIGURATION FOR SUSPENSION STROKE INCREASE

CROSS-REFERENCE TO RELATED APPLICATIONS

This application claims the benefit of U.S. Provisional Application No. 62/730,979 filed on Sep. 13, 2018, which is hereby incorporated by reference in its entirety.

FIELD

Embodiments of the invention relate to the field of suspensions for disk drives. More particularly, this invention relates to the field a microactuator for a suspension.

BACKGROUND

A typical disk drive unit includes a spinning magnetic disk containing a pattern of magnetic storage medium ones and zeroes on it that constitutes the data stored on the disk drive. The magnetic disk is driven by a drive motor. The disk drive unit further includes a disk drive suspension to which a magnetic read/write is mounted proximate a distal end of a load beam. The "proximal" end of a suspension or load beam is the end that is supported, i.e., the end nearest to the base plate which is swaged or otherwise mounted to an actuator arm. The "distal" end of a suspension or load beam is the end that is opposite the proximal end, i.e., the "distal" end is the cantilevered end.

The suspension is coupled to an actuator arm, which in turn is coupled to a voice coil motor that moves the suspension arcuately in order to position the head slider over the correct data track on the data disk. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor moves the suspension.

In a DSA suspension a small actuator located on the suspension moves the head slider in order to position the head slider over the correct data track. The actuator provides both finer positioning of the head slider than does the voice coil motor, and provides higher servo bandwidth than does the voice coil motor. The actuator may be located in various places on the suspension depending on the particular DSA suspension design. Typically, left- and right-side actuators act in push-pull fashion to rotate the load beam or the distal end of the load beam. Some of the earliest DSA suspension designs placed the actuator on the baseplate, with actuation of the piezoelectric microactuators (PZTs) causing the entire load beam to rotate. Actuators used in DSA suspension have been called milliactuators or microactuators. DSA suspensions have become common in recent years as data track widths have continued to decrease.

SUMMARY

A piezoelectric actuator assembly is described. The assembly including a first layer including a single active piezoelectric layer, the first layer including a top and a bottom surfaces. The assembly including a second layer including as a single active piezoelectric layer, the second layer having a top and a bottom surfaces, the bottom surface of the second layer is disposed over the top surface of the first layer. The assembly including a third layer including as a single active piezoelectric layer, the third layer having a top and a bottom surfaces, the bottom surface of the third layer is disposed over the top surface of the second layer. A first electrode is disposed on at least a portion of the bottom surface of the first layer. A second electrode is disposed between at least a portion of the first layer and the second layer, a third electrode is disposed between at least a portion of the second layer and the third layer, a fourth electrode is disposed on at least a portion of the top surface of the third layer. The third electrode is configured to be shorter than the second electrode such that the active PZT length of the second layer and the third layer is shorter than the active PZT length of the first layer.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

In order to describe the manner in which the advantages and features of the disclosure can be obtained. Embodiments of the present disclosure are described with reference to specific examples illustrated in the appended drawings. These drawings depict only example aspects of embodiments of the present disclosure, and are therefore not to be considered as limiting of its scope. The principles are described and explained with additional specificity and detail through the use of the following drawings.

DETAILED DESCRIPTION

Figure 1:
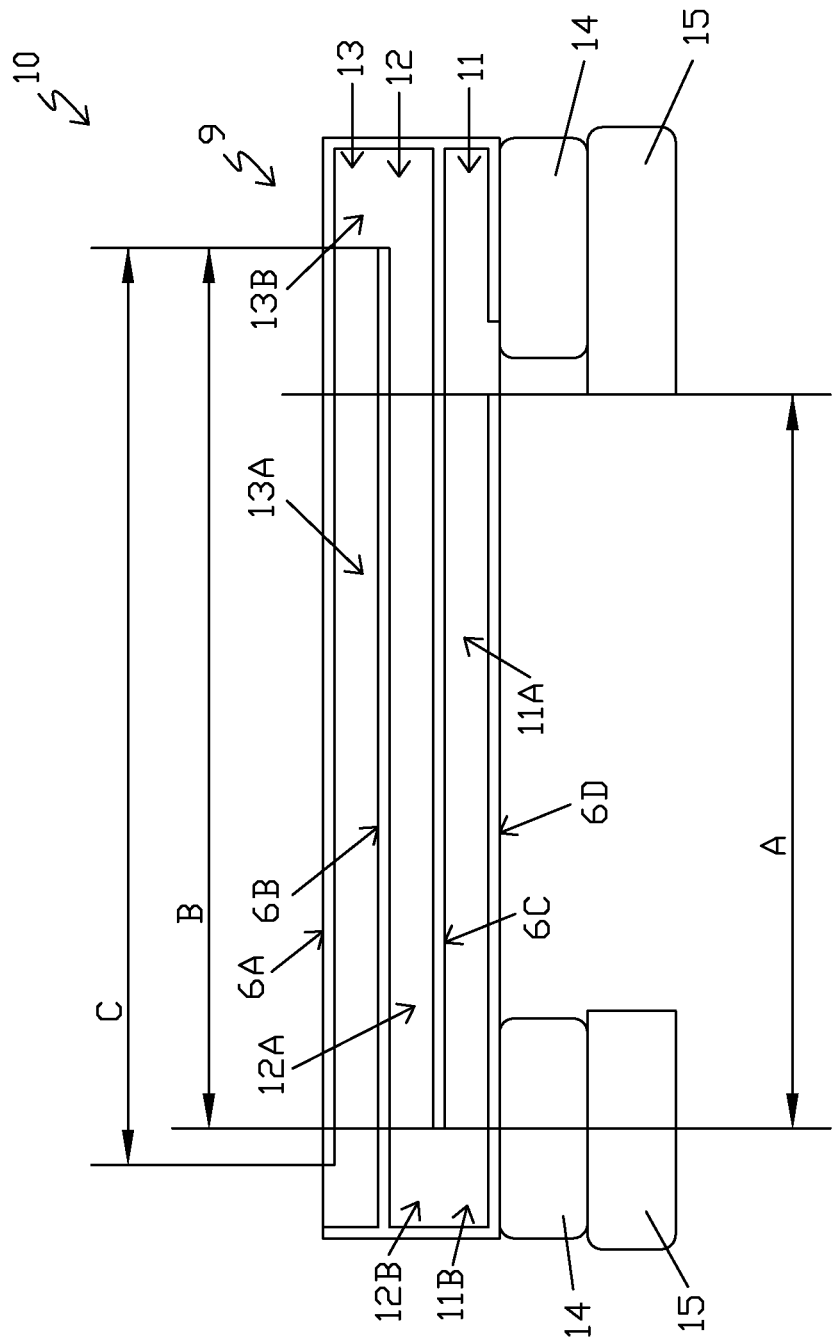
FIG. 1 illustrates a cross-sectional view of a conventional DSA suspension and a microactuator assembly.

The embodiments of the present disclosure are described with reference to the attached figures, wherein like reference numerals are used throughout the figures to designate similar or equivalent elements. The figures are not drawn to scale, and they are provided as exemplary illustrations. Several aspects of the embodiments are described below with reference to example applications, which are not intended to limit the scope of this disclosure. It should be understood that numerous specific details, relationships, and methods are set forth to provide a full understanding of the embodiments. One having ordinary skill in the relevant art, however, will readily recognize that the invention can be practiced without one or more of the specific details, or with other methods. In other instances, well-known structures or operations are not shown in detail to avoid obscuring the embodiments. Embodiments of the present disclosure are not limited by the illustrated ordering of acts or events, as some acts may occur in different orders and/or concurrently with other acts or events. Furthermore, not all illustrated acts or events are required to implement a methodology in accordance with the present invention.

FIG. 1 illustrates a cross-sectional view of a conventional DSA suspension 10 and a microactuator assembly 9. A piezoelectric element is often used as the microactuator motor, although static electric microactuators and other types of microactuator motors have been proposed and used. A commonly used piezoelectric material is lead zirconate titanate (PZT), although other piezoelectric materials are also used and known. In the discussion and claims that follows, for simplicity the piezoelectric device that is the microactuator will sometimes be referred to simply as a "PZT" for shorthand, it being recognized that the piezoelectric material need not be lead zirconate titanate. Thus, as used herein the term "PZT" can refer to any piezoelectric material or any piezoelectric device formed of any piezoelectric material.

The microactuator assembly 9 can include a first PZT layer 11, a second PZT layer 12, and a third PZT layer 13. The first PZT layer 11 can be the bottom layer of the microactuator assembly 9. The first PZT layer 11 can have an active PZT 11A and a non-active PZT 11B. The second PZT layer 12 can be the middle layer of the microactuator assembly 9. The second PZT layer 12 can have an active PZT 12A and a non-active PZT 12B. The first PZT layer 11 can be adhered to an underside of the second PZT layer 12. The third PZT layer 13 can be the top layer of the microactuator assembly 9. The third PZT layer 13 can have an active PZT 13A and a non-active PZT 13B. The third PZT layer 13 can be adhered to the second PZT layer 12 on the top surface of the second PZT layer 12.

The microactuator assembly 9 is coupled with the trace gimbal flexure portion 15 of the DSA suspension 10 using electrically conductive adhesive (ECA) 14. In some embodiments, the trace gimbal flexure portion 15 and the ECA 14 can be separated by a gold layer. The gold layer can provide corrosion resistance and enhanced conductivity to the trace gimbal flexure portion 15.

Generally, when the conventional microactuator assembly 9 is used for the DSA suspension 10, the PZT electrodes of all three layers are maximized to aim for a higher stroke. Since the first PZT layer 11 is bonded to the trace gimbal flexure portion 15, it has longer non-active PZT portions than the second PZT layer 12 and the third PZT layer 13. FIG. 1 shows that the active length A of the first PZT layer 11 is shorter than the active length B of the second PZT layer 12 and the active length C of the third PZT layer 13.

Figure 2:
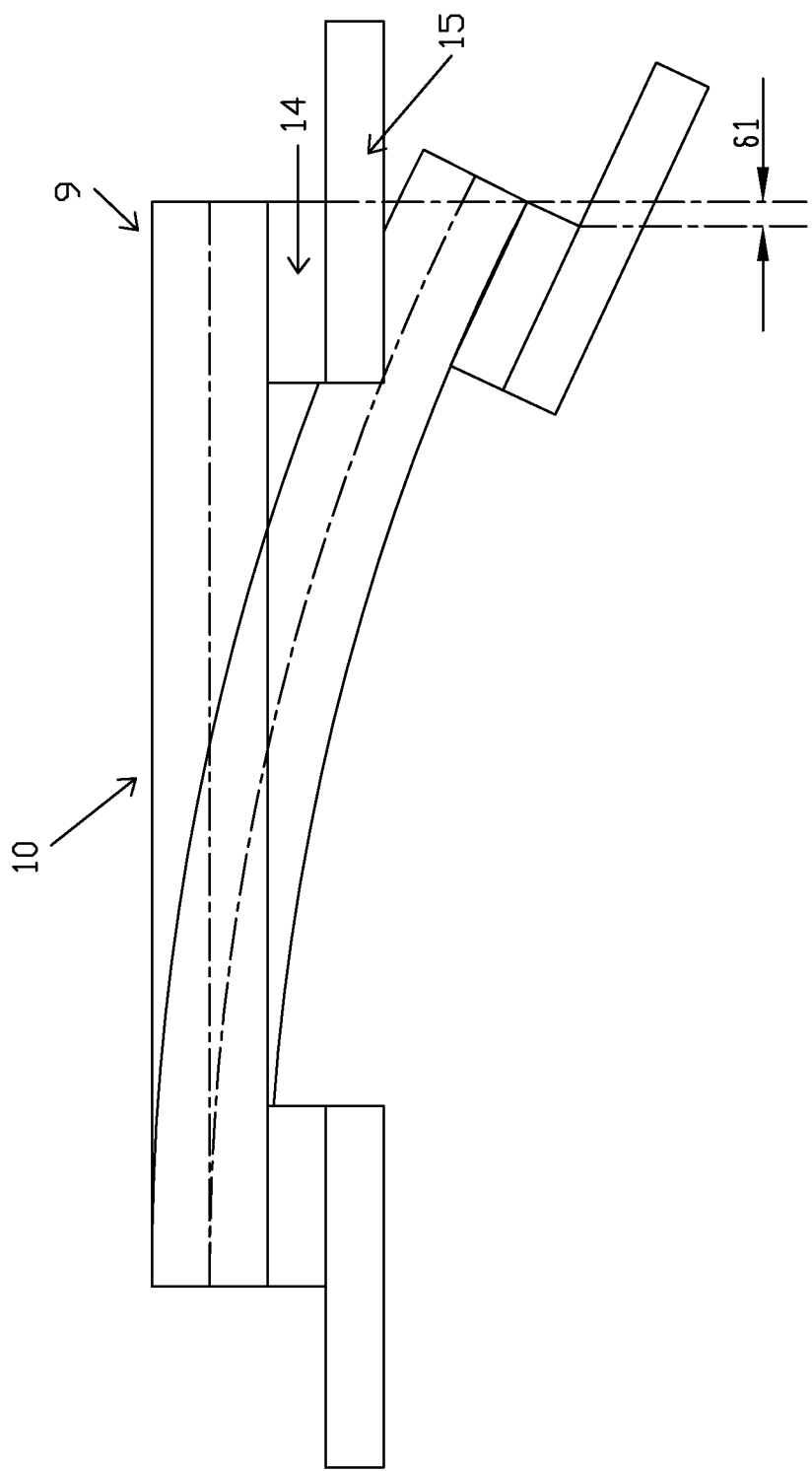
FIG. 2 illustrates the conventional DSA assembly of FIG. 1 in an extension mode.

FIG. 2 illustrates the conventional DSA assembly 10 in an extension mode. As described with reference to FIG. 1, since the active length C and B is longer than the active length A, the third PZT layer 13 and the second PZT layer 12 are supposed to extend longer than the first PZT layer 11. However, since they are adhered together, the unbalanced extensions among three PZT layers cause the PZT to bend into a convex shape, as is shown in FIG. 2. In addition, the first PZT layer 11 is bonded at its proximal and distal ends to the trace gimbal flexure portion 15, which further constrains the extension of the first PZT layer 11 and then further increases the convex shape bending, which leads to a negative stroke delta δ1 under the PZT extension mode to reduce the total stroke.

Figure 3:
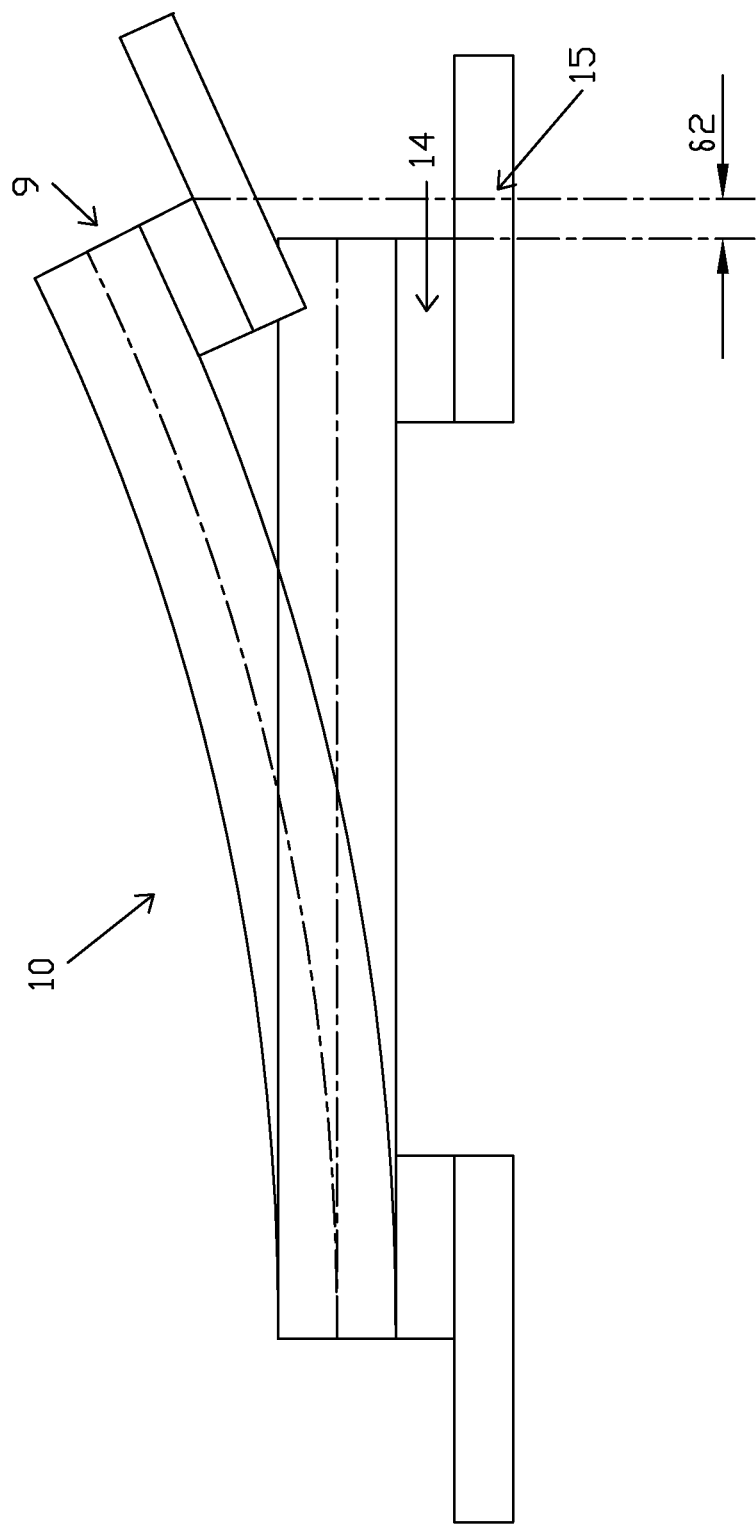
FIG. 3 illustrates the conventional DSA assembly of FIG. 1 in a contract mode.

FIG. 3 illustrates the conventional DSA assembly 10 in a contract mode. Since the active length C and B is longer than the active length A, the third PZT layer 13 and the second PZT layer 12 are supposed to contract longer than the first PZT layer 11. However, since they are adhered together, this unbalanced contraction among three PZT layers cause the PZT to bend into a concave shape, as is shown in FIG. 3. Additionally, the first PZT layer 11 is bonded at its proximal and distal ends to the trace gimbal flexure portion 15, which further constrains the contraction of the first PZT layer 11 and then further increases the concave shape bending, which leads to a positive stroke delta δ2 under the PZT contraction mode to reduce the total stroke. Therefore, due to the electrode length configuration in PZT layers, the conventional microactuator assembly 9 has a lower stroke under both PZT extension mode and contraction mode. The present application provides a novel configuration of the microactuator assembly 9 to overcome the stroke reduction issues and increase suspension stroke.

Figure 4A:
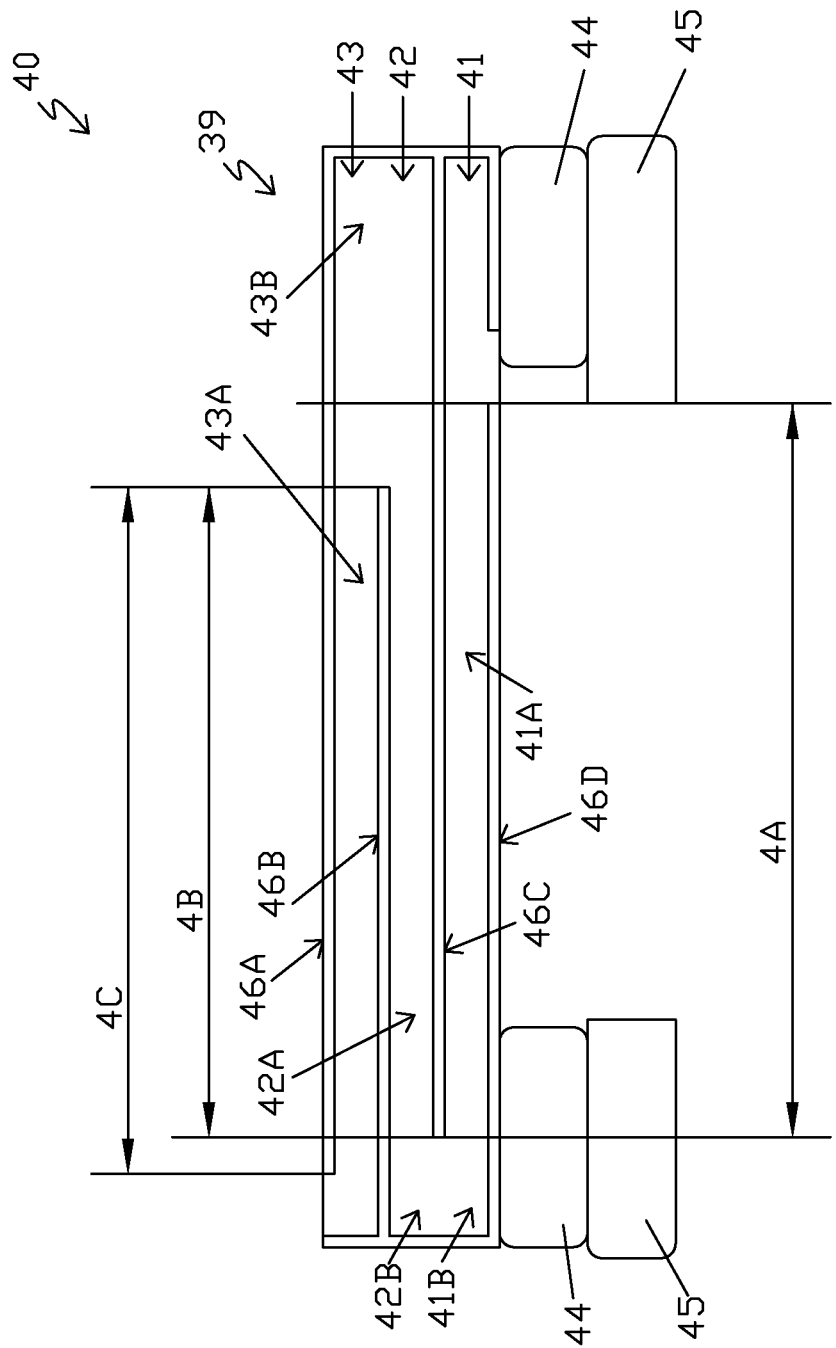
FIG. 4A illustrates a cross-sectional view of a DSA suspension and a microactuator assembly, in accordance with an embodiment of the disclosure.

FIG. 4A illustrates a cross-sectional view of a DSA suspension 40 and a microactuator assembly 39, in accordance with an embodiment of the disclosure. The microactuator assembly 39 can include a first PZT layer 41, a second PZT layer 42, and a third PZT layer 43. The first PZT layer 41 can have an active PZT 41A and a non-active PZT 41B. The second PZT layer 42 can have an active PZT 42A and a non-active PZT 42B. The third PZT layer 43 can have an active PZT 43A and a non-active PZT 43B.

The first PZT layer 41 can be the bottom layer of the microactuator assembly 39. The second PZT layer 42 can be the middle layer of the microactuator assembly 39. The first PZT layer 41 can be adhered to an underside of the second PZT layer 42. The third PZT layer 43 can be the top layer of the microactuator assembly 39. The third PZT layer 43 can be adhered to the second PZT layer 42 on the top surface of the second PZT layer 42. The microactuator assembly 39 is electronically coupled with the DSA suspension 40 that includes a trace gimbal flexure portion 45 through electrically conductive adhesive (ECA) 44. In some embodiments, the trace gimbal flexure portion 45 and the ECA 44 can be separated by a gold layer. The gold layer can provide corrosion resistance and enhanced conductivity to the trace gimbal flexure portion 45.

Figure 4B:
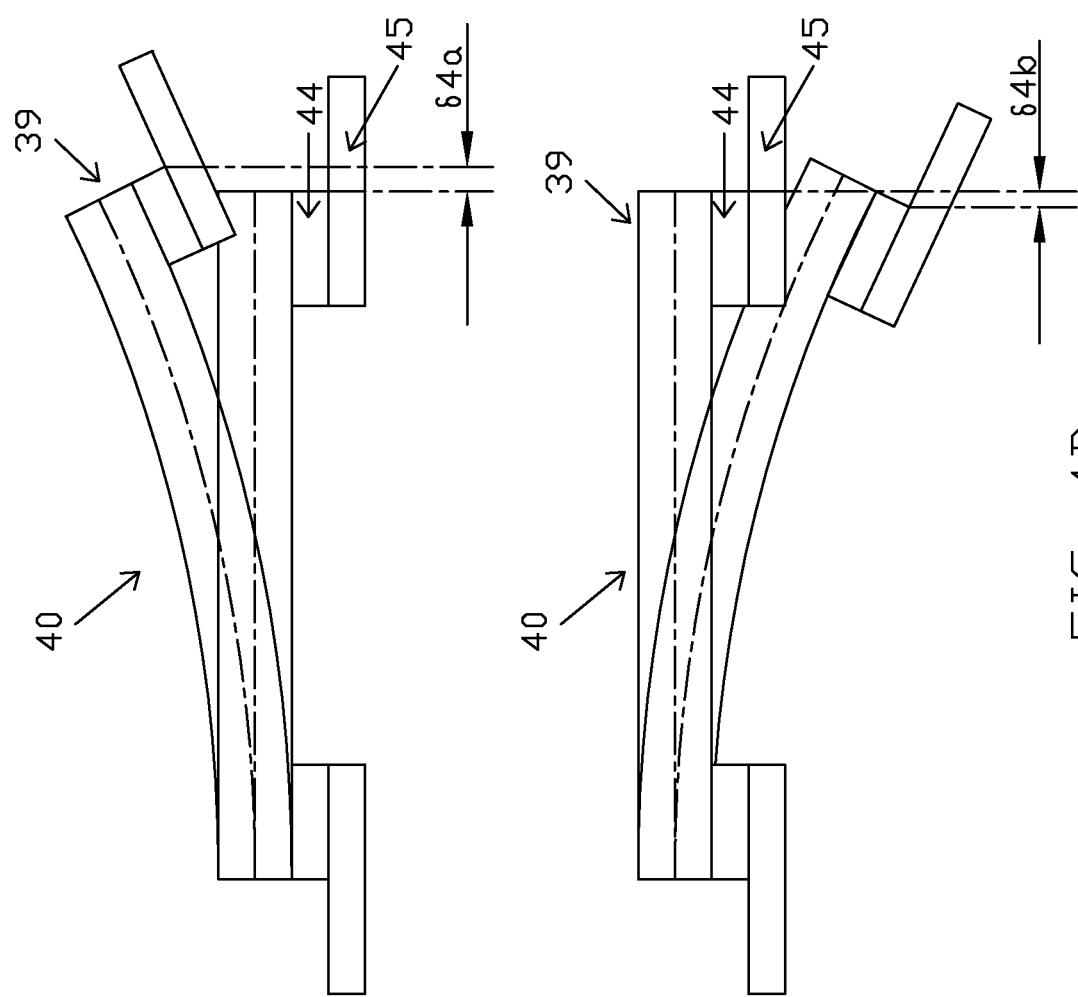
FIG. 4B illustrates a DSA suspension in extension mode and in contraction mode, in accordance with an embodiment of the disclosure.

As illustrated in FIG. 4A, the active PZT of the various layers and the PZT electrodes 46 between the layers are of different lengths. The PZT electrode (46B) between the second and third PZT layers 42 and 43 can be shortened such that the active length 4B of the second PZT layer 42 and the active length 4C of the third PZT layer 43 are shorter than the active length 4A of the first PZT layer 41. Since the second PZT layer 42 and the third PZT layer 43 have shorter active length 4B and 4C than the first PZT layer 41 active length 4A, the second PZT layer 42 and the third PZT layer 43 have shorter extension than the first PZT layer 41 under PZT extension mode, which results in microactuator 39 bending into a concave shape as shown in FIG. 4B top sketch and generates a positive stroke delta 64a under the PZT extension mode to increase the total stroke. Conversely, under PZT contraction mode, since the second PZT layer 42 and the third PZT layer 43 have shorter active length 4B and 4C than the first PZT layer 41 active length 4A, the second PZT layer 42 and the third PZT layer 43 have shorter contraction than the first PZT layer 41 under PZT contraction mode, which results in microactuator 39 bending into a convex shape in FIG. 4B bottom sketch and generates a negative stroke delta Mb under the PZT contraction mode to increase the total stroke. In some embodiments, the PZT electrode 46B between the second PZT layer 42 and third PZT layer 43 can be shorter than the PZT electrode 46D disposed on first PZT layer 41 by between 0.05 mm to 0.15 mm, the stroke of the microactuator assembly 39 can be increased between 5 and 10%. For some embodiments, the PZT electrode 46B between the second PZT layer 42 and third PZT layer 43 can be shorter than the PZT electrode 46D disposed on first PZT layer 41 by 0.12 mm, increasing the stroke of the microactuator assembly 39 by 7.3%.

Figure 5:
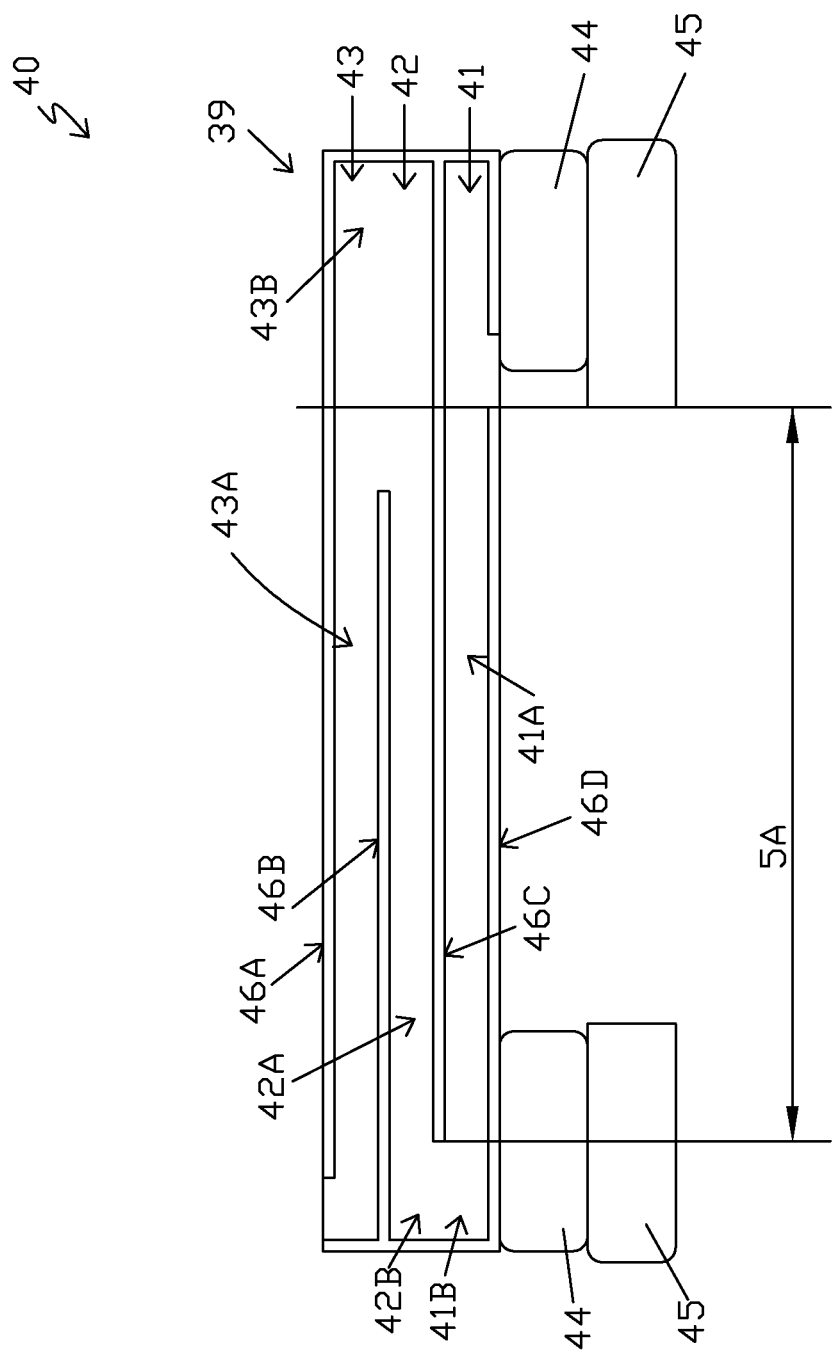
FIG. 5 illustrates an alternative conventional DSA suspension and a microactuator assembly of FIG. 4, in accordance with an embodiment of the disclosure.

FIG. 5 illustrates another embodiment of a microactuator assembly 39 as part of a DSA suspension 40. As is shown in FIG. 5, the active PZT of the various layers and the PZT electrodes 46 are of different lengths. The PZT electrode 46A disposed on the active PZT 43A of the third PZT layer 43 is shortened, such that the active length 5C of the third PZT layer 43 is shorter than the active length 5B of the second PZT layer 42 and the active length 5A of the first PZT layer 41. In some embodiments, the PZT electrode 46A disposed on active PZT 43A of the third PZT layer 43 can be shorter than the PZT electrode 46C disposed on active PZT 41A of the first PZT layer 41 by between 0.10 and 0.30 mm. When the PZT electrode 46A disposed on the active PZT 43A of the third PZT layer 43 is shortened within this range, the stroke of the microactuator assembly 39 can be increased between 15 to 25%. According to some embodiments, the PZT electrode 46A disposed on the active PZT 43A of the third PZT layer 43 can be shorter than the PZT electrode 46C disposed on active PZT 41A of the first PZT layer 41 by 0.2 mm, increasing the stroke of the microactuator assembly 39 by 18.6%.

Figure 6:
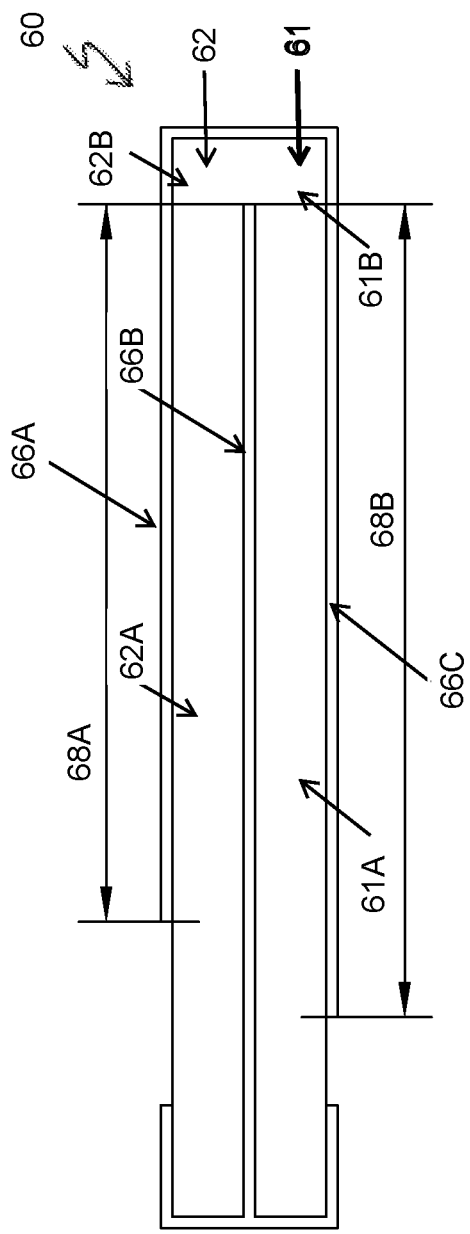
FIG. 6 illustrates a cross-sectional view of a microactuator assembly 60 having two layers, in accordance with an embodiment of the disclosure.

FIG. 6 illustrates a cross-sectional view of a microactuator assembly 60 having two layers, in accordance with an embodiment of the disclosure. The microactuator assembly 60 includes a first PZT layer 61 and a second PZT layer 62. The first PZT layer 61 is configured to have an active PZT 61A and a non-active PZT 61B. The second PZT layer 62 is configured to have an active PZT 62A and a non-active PZT 62B.

As illustrated in FIG. 6, the active PZT of the various layers and the PZT electrodes 66 between the layers are of different lengths. The PZT electrode (66B) between the first and second PZT layers 61 and 62 is configured such that the active length 68A of the second PZT layer 62 is shorter than the active length 68B of the first PZT layer 61. This results in enabling a beneficial bending profile, such as a concave shape under the PZT extension mode as described herein. Conversely, under PZT contraction mode the microactuator 60 is configured to bend into a convex shape to increase the total stroke, similar to that described herein. Embodiments of the microactuator 60 include having PZT layers and PZT electrodes configured using techniques described herein.

Figure 7:
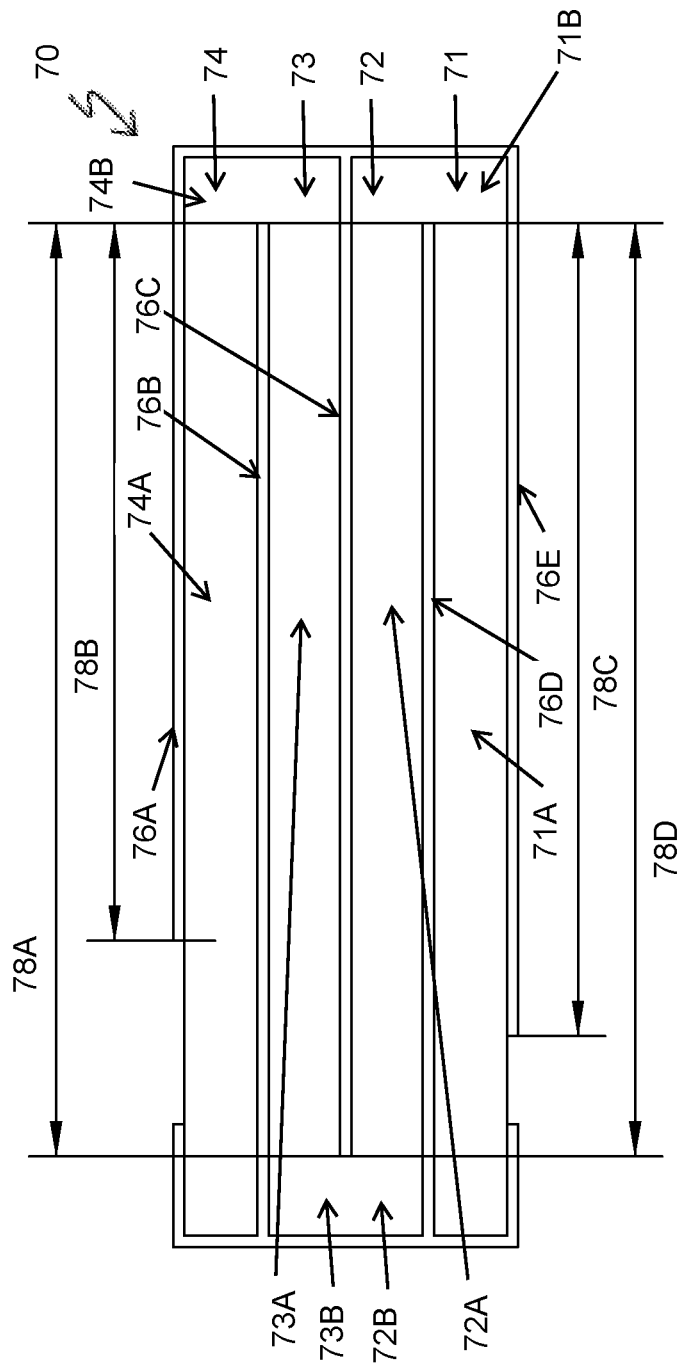
FIG. 7 illustrates a cross-sectional view of a microactuator assembly 70 having four layers, in accordance with an embodiment of the disclosure.

FIG. 7 illustrates a cross-sectional view of a microactuator assembly 70 having four layers, in accordance with an embodiment of the disclosure. The microactuator assembly 70 includes a first PZT layer 71, a second PZT layer 72, a third PZT layer 73, and a fourth PZT layer 74. The first PZT layer 71 is configured to have an active PZT 71A and a non-active PZT 71B. The second PZT layer 72 is configured to have an active PZT 72A and a non-active PZT 72B. The third PZT layer 73 is configured to have an active PZT 73A and a non-active PZT 73B. The fourth PZT layer 74 is configured to have an active PZT 74A and a non-active PZT 74B.

As illustrated in FIG. 7, the active PZT of the various layers and the PZT electrodes 76 between the layers are of different lengths. The PZT electrodes 76 are configured such that the active length 78B of the fourth PZT layer 74 is shorter than the active length 78C of the first PZT layer 71. The PZT electrodes 76 are further configured such that the active length 78B of the fourth PZT layer 74 is shorter than the active length 78A of the second PZT layer 72. The PZT electrodes 76 are further configured such that the active length 78B of the fourth PZT layer 74 is shorter than the active length 78D of the third PZT layer 73. This results in enabling a beneficial bending profile, such as a concave shape under the PZT extension mode as described herein. Conversely, under PZT contraction mode the microactuator 70 is configured to bend into a convex shape to increase the total stroke. Embodiments of the microactuator 70 include having PZT layers and PZT electrodes configured using techniques described herein.

The embodiments described herein overcome the problems with conventional multi-layer PZT electrode configurations that can generate a lower stroke. Such configurations can cause the PZT to deform into a convex shape during the extension mode and a concave shape during the contraction mode, which leads to a lower total stroke. Conversely, the current invention configures the PZT electrode length to cause the PZT to deform into a concave shape during the extension mode and a convex shape during the contraction mode to increase the total stroke.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A piezoelectric actuator assembly having a first end and a second end, the assembly comprising:
   a first layer including as a single active piezoelectric layer, the first layer including a top surface and a bottom surface;
   a second layer including as a single active piezoelectric layer, the second layer having a top surface and a bottom surface, wherein the bottom surface of the second layer is disposed over the top surface of the first layer;
   a third layer including as a single active piezoelectric layer, the third layer having a top surface and a bottom surface, wherein the bottom surface of the third layer is disposed over the top surface of the second layer; and
   a first electrode disposed on at least a portion of the bottom surface of the first layer, a second electrode disposed between at least a portion of the first layer and the second layer, a third electrode disposed between at least a portion of the second layer and the third layer, a fourth electrode disposed on at least a portion of top surface of the third layer,
   wherein the third electrode is configured to be shorter than the second electrode such that the active piezoelectric layer length of the second layer and the third layer is shorter than the active piezoelectric layer length of the first layer.

2. The piezoelectric actuator assembly of claim 1, wherein the third electrode is configured to be shorter than the second electrode by between 0.05 mm to 0.15 mm.

3. The piezoelectric actuator assembly of claim 2, wherein the third electrode is configured to be shorter than the second electrode by 0.12 mm.

4. The piezoelectric actuator assembly of claim 1 further comprising:
the fourth electrode configured to be shorter than the third electrode by between 0.10 and 0.30 mm.

5. The piezoelectric actuator assembly of claim 4, wherein the fourth electrode is configured to be shorter than the third electrode by 0.20 mm.

6. The piezoelectric actuator assembly of claim 4, wherein the single active piezoelectric layer of the first layer and the single active piezoelectric layer of second layer have longer active length than the single active piezoelectric layer of the third layer between 0.10 and 0.30 mm.

7. The piezoelectric actuator assembly of claim 6, wherein the single active piezoelectric layer of the first layer and the single active piezoelectric layer of second layer have longer active length than the single active piezoelectric layer of the third layer by 0.20 mm.

8. A microactuator comprising:
a first layer including as a single active piezoelectric layer, the first layer including a top surface and a bottom surface;
a second layer including as a single active piezoelectric layer, the second layer having a top surface and a bottom surface, wherein the bottom surface of the second layer is disposed over the top surface of the first layer;
a third layer including as a single active piezoelectric layer, the third layer having a top surface and a bottom surface, wherein the bottom surface of the third layer is disposed over the top surface of the second layer; and
a first electrode disposed on at least a portion of the bottom surface of the first layer, a second electrode disposed between at least a portion of the first layer and the second layer, a third electrode disposed between at least a portion of the second layer and the third layer, a fourth electrode disposed on at least a portion of the top surface of the third layer,
wherein the third electrode is configured to be shorter than the second electrode such that the active piezoelectric layer length of the second layer and the third layer is shorter than the active piezoelectric layer length of the first layer.

9. The microactuator of claim 8, wherein the third electrode is configured to be shorter than the second electrode by between 0.05 mm to 0.15 mm.

10. The microactuator of claim 8, wherein the third electrode is configured to be shorter than the second electrode by 0.12 mm.

11. The microactuator of claim 8 further comprising:
the fourth electrode configured to be shorter than the third electrode by between 0.10 and 0.30 mm.

12. The microactuator of claim 11, wherein the fourth electrode is configured to be shorter than the third electrode by 0.20 mm.

13. The microactuator of claim 11, wherein the single active piezoelectric layer of the first layer and the single active piezoelectric layer of second layer have longer piezoelectric layer active length than the single active piezoelectric layer of the third layer between 0.10 and 0.30 mm.

14. The microactuator of claim 11, wherein the single active piezoelectric layer of the first layer and the single active piezoelectric layer of second layer have longer piezoelectric layer active length than the single active piezoelectric layer of the third layer by 0.20 mm.

* * * * *